(12) United States Patent
Deboy (10) Patent No.: US 9,559,602 B2
(45) Date of Patent: Jan. 31, 2017

(54) MAGNETIZING CURRENT BASED CONTROL OF RESONANT CONVERTERS

(71) Applicant: Infineon Technologies Austria AG, Villach (AT)

(72) Inventor: Gerald Deboy, Klagenfurt (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 14/632,664

(22) Filed: Feb. 26, 2015

(65) Prior Publication Data
US 2016/0254755 A1 Sep. 1, 2016

(51) Int. Cl.
*H02M 3/335* (2006.01)

(52) U.S. Cl.
CPC .............................. *H02M 3/33546* (2013.01)

(58) Field of Classification Search
CPC . H02M 1/083; H02M 1/44; H02M 2001/0058
See application file for complete search history.

(56) References Cited

U.S. PATENT DOCUMENTS

| | | | | |
|---|---|---|---|---|
| 7,580,595 B1* | 8/2009 | Bimberg | ................ | B82Y 20/00 385/132 |
| 8,026,704 B2 | 9/2011 | Kapels et al. | | |
| 8,487,480 B1* | 7/2013 | Kesler | .................. | B60L 11/007 307/104 |
| 8,692,410 B2* | 4/2014 | Schatz | .................. | H01Q 1/248 307/104 |
| 8,796,082 B1* | 8/2014 | Shah | ..................... | H01L 29/872 257/194 |
| 9,160,203 B2* | 10/2015 | Fiorello | | |
| 9,210,790 B2* | 12/2015 | Hoffman | .................. | H05H 1/46 |
| 2001/0036087 A1* | 11/2001 | Raets | ................ | H02M 3/33561 363/17 |
| 2001/0036089 A1* | 11/2001 | Gattavari | .............. | H02M 3/335 363/21.01 |
| 2007/0241833 A1* | 10/2007 | Nervegna | .............. | H03K 3/011 331/176 |
| 2011/0157931 A1* | 6/2011 | Sato | ..................... | H02M 7/5387 363/56.02 |
| 2011/0181128 A1* | 7/2011 | Perreault | ............... | H02M 7/797 307/151 |
| 2012/0195074 A1* | 8/2012 | Lehn | ..................... | H02M 3/155 363/17 |

(Continued)

OTHER PUBLICATIONS

Abdel-Rahman, S., "Resonant LLC Converter: Operation and Design, 250W 33Vin 400Vout Design Example," Infineon Technologies North America (IFNA) Corp., Application Note AN Sep. 2012, V1.0. Sep. 2012, 19 pp.

(Continued)

*Primary Examiner* — Timothy J Dole
*Assistant Examiner* — Yusef Ahmed
(74) *Attorney, Agent, or Firm* — Shumaker & Sieffert, P.A.

(57) ABSTRACT

A resonant converter is described that includes at least one power switch. The at least one power switch is characterized by a non-linearity coefficient that is less than or equal to a first threshold and a figure-of-merit that is less than or equal to a second threshold. The figure-of-merit being associated with an on-resistance of the at least one power switch and an output charge of the at least one power switch.

24 Claims, 7 Drawing Sheets

(56) References Cited

U.S. PATENT DOCUMENTS

| | | | | |
|---|---|---|---|---|
| 2012/0228953 A1* | 9/2012 | Kesler | .................... | H03H 7/40 |
| | | | | 307/104 |
| 2012/0268969 A1* | 10/2012 | Cuk | ...................... | H02M 7/48 |
| | | | | 363/17 |
| 2012/0287678 A1* | 11/2012 | Xu | ...................... | H02M 3/158 |
| | | | | 363/17 |
| 2013/0121033 A1* | 5/2013 | Lehn | .................... | H02M 3/335 |
| | | | | 363/17 |
| 2014/0210370 A1* | 7/2014 | Pawellek | .............. | H05B 41/36 |
| | | | | 315/224 |
| 2014/0284701 A1* | 9/2014 | Korec | ................ | H01L 29/7824 |
| | | | | 257/328 |
| 2014/0353574 A1* | 12/2014 | Li | ...................... | H01L 29/0673 |
| | | | | 257/9 |
| 2015/0015071 A1* | 1/2015 | Deboy | ................. | H02M 3/335 |
| | | | | 307/31 |
| 2015/0069855 A1* | 3/2015 | De Rooij | ............... | H03F 1/565 |
| | | | | 307/104 |
| 2015/0222178 A1* | 8/2015 | Skinner | .............. | H02M 1/4225 |
| | | | | 363/126 |
| 2015/0229200 A1* | 8/2015 | Schwartz | ............ | H02M 3/3376 |
| | | | | 363/21.03 |

OTHER PUBLICATIONS

Kolar, J.W., et al., "Extreme Efficiency Power Electronics," 7th International Conference on Integrated Power Electronics Systems (CIPS), Mar. 6-8, 2012, 22 pp.

Kolar, J.W., et al., "High-performance rectifier system with 99.2% efficiency," ELEKTRONIKPRAXIS Power Electronics & Power Supply, Mar. 2012, 5 pp.

* cited by examiner

MAGNETIZING CURRENT BASED CONTROL OF RESONANT CONVERTERS

BACKGROUND

A resonant circuit (also referred to as a "resonant tank") enables a resonant converter to change its gain (e.g., so as to compensate for changes to at its input and/or the requirements of a load) by adjusting the switching frequency of its power switches. A resonant converter may operate its power switches over a wide range of switching frequencies in order to achieve just the right output voltage or current at just the right time. To improve efficiency and reduce power losses, some resonant converters perform zero voltage switching (ZVS) or zero current switching (ZCS) techniques.

Some resonant converters rely either on a magnetizing current (e.g., in the case of an LLC converter) from the resonant circuit or a load current (e.g., in the case of a phase shift ZVS converter) to charge the output capacitance of their respective power switches so as to achieve ZVS or ZCS, within a reasonable amount of dead time. The level of the magnetizing current or load current depends on the amount of output capacitance associated with the power switches being charged during zero-voltage switch-on.

As is the case, some power switches may require a high magnetizing current to perform a ZVS operation. Use of a high magnetizing current can cause voltage transients, which have a high rate of change (dv/dt), to appear across the power switches. These voltage transients can cause damage and lead to unwanted capacitive couplings which can cause the resonant converter to transfer energy (e.g., from the primary to the secondary side of the resonant converter) when no energy should be transferred. Alternatively, some power switches will require a minimum amount of load current to perform a ZVS operation. The reliance on a load current to charge the output capacitance of its power switches may inhibit a phase shift ZVS converter from performing ZVS during light or no load conditions when the load current is less than the minimum amount being required.

SUMMARY

In general, techniques and circuits are described that enable resonant converters (e.g., isolating resonant converters and non-isolating resonant converters) to continuously maintain a regulation span of an output voltage, with improved efficiency, across a wider range of load conditions. In one example, the disclosure is directed to a resonant converter that includes at least one power switch, wherein the at least one power switch is characterized by a non-linearity coefficient that is less than or equal to a first threshold and a figure-of-merit that is less than or equal to a second threshold. The figure-of-merit being associated with an on-resistance of the at least one power switch and an output charge of the at least one power switch.

In another example, the disclosure is directed to a power circuit that includes a resonant converter. The resonant converter includes at least one half-bridge that has an effective non-linearity coefficient that is less than or equal to five and a figure-of-merit that is less than or equal to eight Ohm*nC. The figure-of-merit is associated with an on-resistance of the at least one half-bridge and an output charge of the at least one half-bridge.

In another example, the disclosure is directed to a system that includes a power source configured to provide power, a controller unit, a load configured to receive the power, and a resonant converter configured to convert the power for the load. The resonant converter includes at least one half-bridge controlled by the controller unit. The at least one half-bridge has an effective non-linearity coefficient that is less than or equal to five and a figure-of-merit that is less than or equal to eight Ohm*nC. The figure-of-merit is associated with an on-resistance of the at least one half-bridge and an output charge of the at least one half-bridge.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
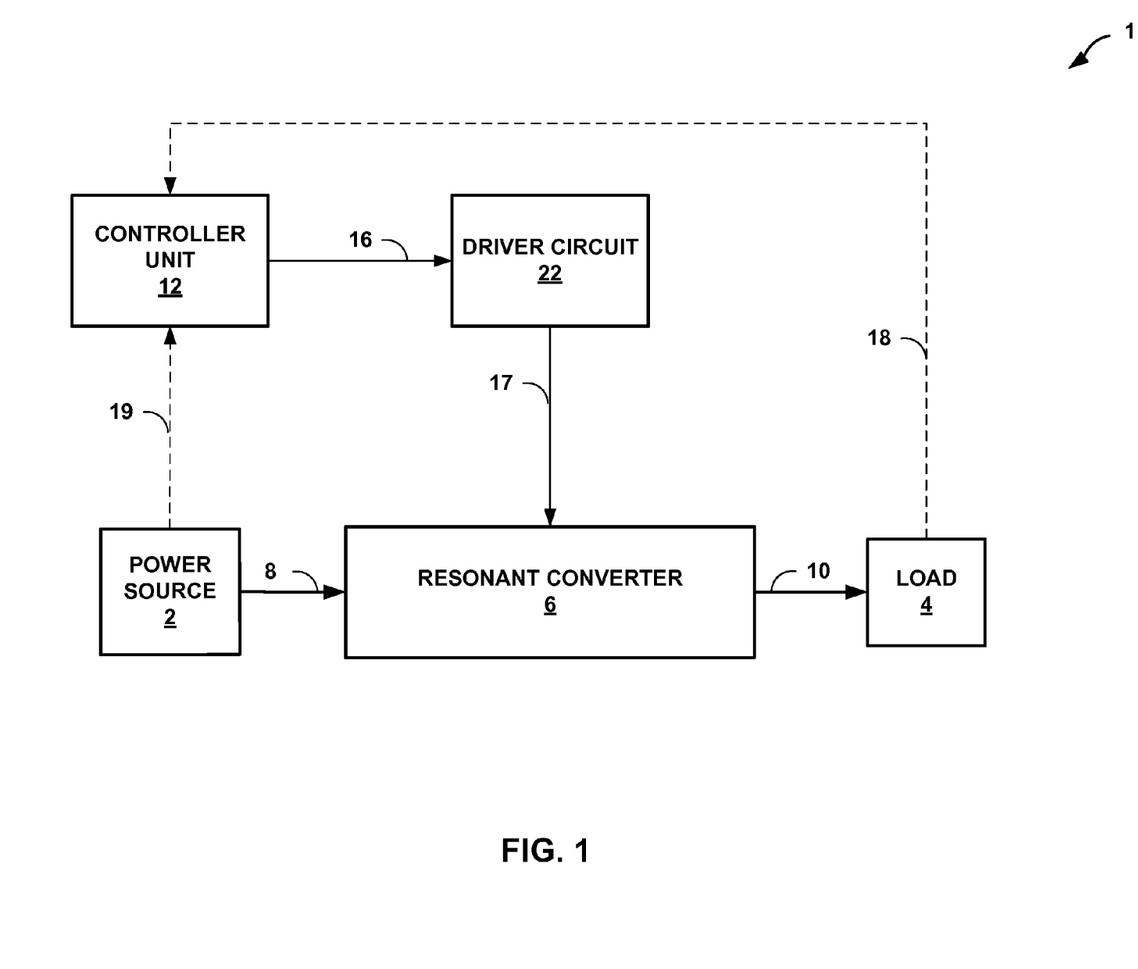
FIG. 1 is a conceptual diagram illustrating an example power system that includes a resonant converter to power a load.

FIG. 1 is a block diagram illustrating an example power system that includes a resonant converter to power a load. In the example of FIG. 1, system 1 has multiple separate and distinct components shown as power source 2, resonant converter 6, load 4, controller unit 12, and driver circuit 22, however, system 1 may include additional or fewer components. For example, power source 2, resonant converter 6, load 4, controller unit 12, and driver circuit 22 may be five individual components (as shown) or may represent any combination of one or more components that provide the functionality of system 1 as described herein.

Power source 2 outputs electrical energy, in the form of power, at link 8. Numerous examples of power source 2 exist and may include, but are not limited to, power grids, generators, power transformers, batteries, solar panels, wind turbines, degenerative braking systems, hydro electrical generators, or any other form of electrical power devices capable of providing electrical power to system 1. As referred to herein, the voltage that power source 2 provides is "the DC link voltage" of system 1.

Load 4 receives, via link 10, electrical power (e.g., voltage, current, etc.) provided by power source 2 and converted by resonant converter 6. Numerous examples of load 4 exist and may include, but are not limited to, computing devices and related components, such as microprocessors, electrical components, circuits, laptop computers, desktop computers, tablet computers, mobile phones, batteries, speakers, lighting units, automotive/marine/aerospace/railway related components, motors, transformers, or any other type of electrical device and/or circuitry that receives a voltage or a current from a resonant converter.

Together, controller unit 12 and driver circuit 22 control resonant converter 6 so as to vary the amount of power that flows between source 2 and load 4. Controller unit 12 may be coupled to driver circuit 22 via link 16 to send and/or receive driver control signals or commands to driver circuit 22 for controlling the operations of resonant converter 6. For example, controller unit 12 may vary the driver control signals sent to driver circuit 22 so as to vary the switching frequency of resonant converter 6 to increase or decrease the voltage at load 4. In some examples, controller unit 12 may also be coupled to load 4 and/or power source 2 (e.g., via links 18 and 19 respectively) to receive information that is indicative of the various electrical characteristics (e.g., voltage levels, current levels, etc.) associated with load 4 and/or power source 2. For example, controller unit 12 may monitor the information associated with load 4 and/or power source 2 to determine when and how much to adjust the switching frequency of resonant converter 6. In some examples, controller unit 12 may send information (e.g., control signals) to load 4 and power source 2 to control their respective operations.

Controller unit 12 may comprise any suitable arrangement of hardware, software, firmware, or any combination thereof, to perform the techniques attributed to controller unit 12 herein. For example, controller unit 12 may include any one or more microprocessors, digital signal processors (DSPs), application specific integrated circuits (ASICs), field programmable gate arrays (FPGAs), or any other equivalent integrated or discrete logic circuitry, as well as any combinations of such components. When controller unit 12 includes software or firmware, controller unit 12 further includes any necessary hardware for storing and executing the software or firmware, such as one or more processors or processing units. In general, a processing unit may include one or more microprocessors, DSPs, ASICs, FPGAs, or any other equivalent integrated or discrete logic circuitry, as well as any combinations of such components.

Controller unit 12 may output one or more driver control signals across link 16 that driver circuit 22 uses to generate one or more gate control signals that cause power switches of resonant converter 6 to switch-on or switch-off. For example, based on a driver control signal received via link 16, driver circuit 22 may generate one or more gate control signals (e.g., pulse-width-modulation [PWM] signals) at link 17 that cause the one or more power switches of resonant converter 6 to switch-on or switch-off.

In some examples, controller unit 12 and driver circuit 22 may together, vary the amount of power that passes between power source 2 and load 4, by varying a duty cycle and/or switching frequency of the gate control signal(s) provided via link 17. In some examples, controller unit 12 and driver circuit 22 may generate, respectively, drive and gate control signals that cause resonant converter 6 to change switching frequencies based on changes that controller unit 12 detects at power source 2 or load 4. For example, driver circuit 22 may receive a driver control signal from controller unit 12 that specifies a particular duty cycle and/or switching frequency that is to be used in controlling the power switches of resonant converter 6. In response to the driver control signal, driver circuit 22 may generate a gate control signal that has the particular duty cycle and/or switching frequency defined by the driver control signal received from controller unit 12. Controller unit 12 may vary the duty cycle and/or switching frequency specified by the driver control signal, and in response, driver circuit 22 may likewise alter and adjust the gate control signals being output at link 17. In this way, controller unit 12 and driver circuit 22 may together cause the power switches of resonant converter 6 to operate in such a way that a certain amount of power passes between power source 2 and load 4 at just the right time.

Links 8, 10, 16, 18, and 20 electrically couple the components of system 1. Each of 8, 10, 16, 18, and 20 represent any wired or wireless medium capable of conducting electrical power or electrical signals from one location to another. Examples of links 8, 10, 16, 18, and 20 include, but are not limited to, physical and/or wireless electrical transmission mediums such as electrical wires, electrical traces, conductive gas tubes, twisted wire pairs, and the like.

Resonant converter 6 is a switch-based power converter that converts the electrical energy provided by power source 2 into a usable form of electrical power required by load 4 by relying, during at least some of its switching cycles, on Zero voltage switching across one or several of its power switches. Cases where the voltage across the switch does not reach Zero volts are sometimes referred to as "quasi resonant" converters. Examples of resonant converter 6 include any type of LLC converter, cyclo inverter, series-resonant half-bridge converter, phase shift zero voltage switching (ZVS) converter, resonant Flyback, resonant buck, resonant boost and the like. The group of resonant converters includes two distinct subgroups, a first subgroup is a set of converters that includes a transformer. A resonant converter that includes a transformer is referred to herein as an isolating resonant converter. A second subgroup is a set of converters that does not include a transformer. A resonant converter that does not include a transformer is referred to herein as a non-isolating resonant converter.

By definition, an isolating resonant converter 6 includes a transformer and a resonant circuit (also referred to herein as a "resonant tank") to charge the primary winding of the transformer before that charge is released to the secondary winding of the transformer and provided to the load. The resonant circuit enables resonant converter 6 to switch its power switches on or off consistent with the resonance defined by the resonant circuit (e.g., to switch on or off at the point when the resonant voltage crosses zero to reduce power loss). In this way, the resonant circuit enables the resonant converter 6 to better perform zero voltage switching (ZVS) when charging the primary winding.

In contrast to the isolating resonant converter, non-isolating resonant converter do not comprise a transformer. Zero voltage switching may be achieved for example by transferring at least in a first operation mode energy from the load 4 back to the power source 2 while transferring energy from the power source to the load in at least one operation mode different from the first operation mode. Examples of this class of converter are triangular current mode boost or resonant buck converter.

As used herein ZVS and ZCS refer to techniques used by a power converter to improve efficiency by expending less energy by switching-on or switching-off a power switch at times when the least amount of energy is required cause the power switch to switch-on or switch-off. To perform ZVS, the power converter may cause a power switch to switch-on when the voltage across the power switch is at or near a minimum voltage (e.g., zero volts). To perform ZCS, the power converter may cause a power switch to switch-on or switch-off when the current through the power switch is at or near a minimum current (e.g., zero amps) or has changed its current flow direction (e.g., by conducting on its body diode).

The resonant circuit enables the resonant converter 6 to better perform ZVS or ZCS when charging the primary winding by predictively switching-on the power switches, to charge the primary winding. As a result, the resonant circuit may cause resonant converter 6 to rely on a variable switching frequency of its power switches. That is, the switching frequency is not necessarily fixed, rather, the switching frequency may change to compensate for changes to an input, the requirements of a load, or other factors.

Some resonant converters are required to have an overall, high degree of efficiency and expend less energy during the power conversion process. Some resonant converters will achieve better efficiency by performing ZVS or ZCS techniques to minimize the amount of energy required to perform a switching operation. In some examples, resonant converters will achieve better efficiency by performing fast switching operations (e.g., take less time to switch-on and/or switch-off) and by operating with as small amount of dead time as possible. And in some examples, a resonant converter may achieve better efficiency by minimizing the magnetizing current associated with the resonant circuit and/or minimizing the charging current used for charging the output capacitance of its power switches during ZVS.

Aside from improved efficiency, some systems will require a resonant converter to be able to operate over a wide range of switching frequencies. As an input voltage, or the voltage or current requirements of a load change (e.g., from a high load condition to a light load or no load condition, short-circuit, start-up, or any other type of load change), resonant converts may control their respective power switches with higher or lower switching frequencies in order to regulate their respective outputs and compensate for the change. In some examples, resonant converters may adapt the switching frequency of their power switches to compensate for other types of changes (e.g., audible noise, or other types of changes). In order to support as wide a range of switching frequencies as possible, these systems may require that the voltage swing (dv/dt) associated with their respective power switches have a narrow band of rate of voltage changes (dv/dt values) and hence having an EMI spectrum, which is relatively easy to filter.

Some resonant converters are required to operate using a lesser amount or smaller charging or resonant tank current. For example, some resonant converters may utilize power switches that have a relatively strong, non-linear output capacitance (Coss) as a function of voltage when charged (e.g., with a constant or near constant charging current, a triangular charging current, or other type of charging current).

For example, consider a resonant converter that uses a Superjunction MOSFET type power switch; these types of resonant converters may have both a reduced efficiency and suffer from voltage transients causing a broad spectrum of radiated or conducted EMI. With regards to efficiency, a power switch that is characterized by a relatively strong, non-linear output capacitance as a function of voltage will require the charging current to be at a fairly high level in order to achieve, within a reasonable amount of dead time, a zero-voltage switch-on. By requiring a higher level of charging current, more energy is required by the resonant tank of the resonant converter or a higher amount of energy needs to be transferred back from the load to the power source. For example, the output capacitance of the Superjunction MOSFET type power switch may by on the order of ten thousand pico farads when the voltage across the power switch falls below fifty volts. The resonant circuit of a resonant converter may be required to use a magnetizing current that is approximately 2 mps in order to charge the output capacitance of the Superjunction MOSFET type power switch so as to attain a zero voltage transition in under one hundred fifty nano seconds.

With further regards to efficiency, the larger charging current may also inhibit certain ZVS operations and cause a resonant converter to operate less efficiently. For example, since a larger charging current is required, a phase shift ZVS type converter may be unable to perform ZVS at light or no load conditions. This is because the charging current used to perform ZVS is derived from the load current. At zero or even light load conditions, the load does not provide sufficient current to charge a large output capacitance of a power switch and perform ZVS operations. As such, these types of converters cannot operate as efficiently down to light or no load conditions.

In addition, not only does a larger charging current reduce the resonant converter's efficiency, but the larger charging current (e.g., when derived from a large magnetizing current associated with a resonant circuit) may induce voltage transients, across the power switches that have a high rate of change (dv/dt) and cause electromagnetic interference over a wide range of rate of voltage changes (dv/dt values) and hence having an EMI spectrum, which is not relatively easy to filter. A high voltage transient with a high rate of change can cause the common mode transient immunity (CMTI) of a driver to malfunction and/or trigger unwanted oscillations associated with various parasitic elements of the resonant converter. In addition, since the transients can appear over a wide range of rate of voltage changes (e.g., dv/dt values) and hence have an EMI spectrum, which is not relatively easy to filter, the transients can in some instances, limit the resonant converter's operable range of switching frequencies.

Furthermore, these transients can produce unwanted oscillations associated with various parasitic elements of the resonant converter. The unwanted oscillations can induce capacitive coupling between two or more parts of the resonant converter. For instance, unwanted oscillations due to transients can cause capacitive coupling between a primary side power switch, the transformer, and a secondary side power switch, between the resonant converter and a common low potential (e.g., a ground), between the primary and secondary side of the resonant converter, and the like. It is these unwanted oscillations that can cause a resonant converter to transfer energy (e.g., from the primary to the secondary side of the resonant converter) when no energy should be transferred. As a result, unwanted oscillations caused by transients can cause the resonant converter to violate the regulation span of its output voltage.

Some resonant converters try to minimize unwanted oscillations with parasitic elements by connecting a fixed capacitance (e.g., a capacitive element such as a capacitor) across the power switches as a way to partially compensate for its large, non-linear output capacitance as a function of voltage.

However, this solution often requires an even higher amount of charging current to charge the output capacitance of the power switch and/or requires even more dead time to perform zero voltage transitions. Other resonant converters may minimize unwanted oscillations with parasitic elements by operating in burst-mode during a light load or a no-load condition. However, operating an burst mode may increase the chances that a body diode of the power switch experiences a hard commutation event since sometimes, the resonant tank or the energy transfer from the load to the source may cause a current flow through the body diode of one of the power switches while the other one in the same half bridge is about to turn-on when a new series of bust-mode pulses begins.

In accordance with the circuits and techniques of this disclosure, example resonant converters, such as resonant converter 6, may continuously maintain the regulation span of its output voltage, with improved efficiency, while performing ZVS and/or ZCS techniques, even in light or no load conditions. The example resonant converters utilizes, as power switches, specific devices which have certain attributes that enable the example resonant converters to: perform voltage transitions within a narrow band of rate of voltage changes (dv/dt values) and hence having an EMI spectrum, which is relatively easy to filter, have a short dead time, and realize high efficiency. Unlike other resonant converters that suffer from, or have to protect against, the aforementioned draw backs (e.g., larger charging current, reduced efficiency, voltage transients, parasitic oscillations, etc.) associated with power switches that have a large, non-linear output capacitance as a function of voltage, the example resonant converter is not only protected from these aforementioned drawbacks, but also operates more efficiently and across a wider range of load conditions.

As is described in detail with respect to the additional FIGS. (e.g., FIGS. 2 and 3), the example resonant converters described herein rely on devices that are being utilized as power switches that when combined (e.g., arranged in a half-bridge, or a full bridge [H-bridge]), have a low, very linear output capacitance (Coss) and a very low, output capacitance charge (Qoss) (e.g., at the switching node of the half-bridge or H-bridge). As such, when resonant converter 6 is an LLC type resonant converter, resonant converter 6 can utilize a low magnetizing current to charge the output capacitance of their respective power switches so as to achieve ZVS or ZCS, within a reasonable amount of dead time and when resonant converter 6 is a phase shift ZVS type resonant converter, resonant converter 6 can maintain ZVS operation even at light load conditions. If resonant converter 6 is a Triangular current mode boost converter, resonant converter 6 can operate at a very high switching frequency with very good efficiency while requiring only a relatively low amount of energy transferred back from the load to perform ZVS operation of the power switches.

Figure 2:
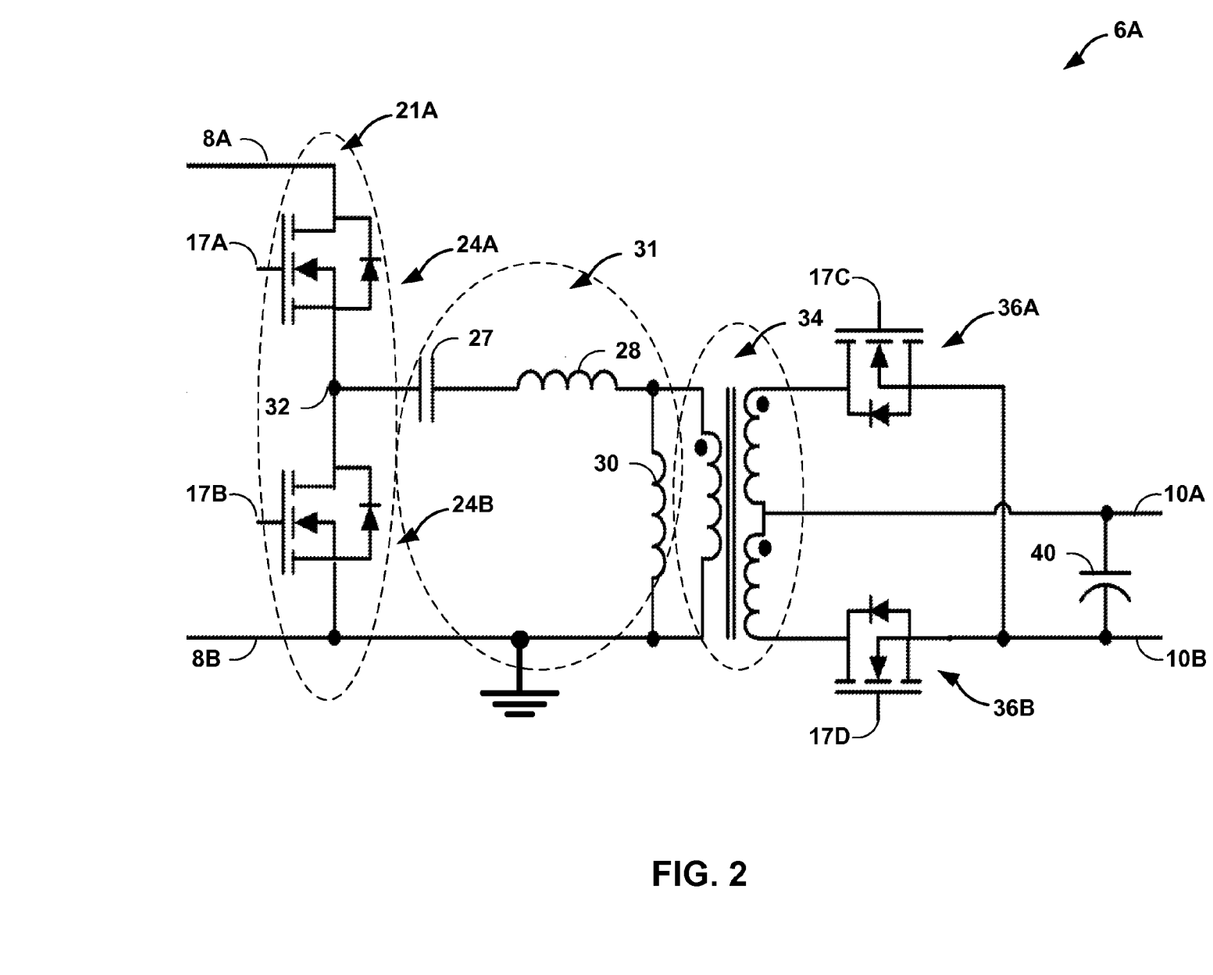
FIG. 2 is a conceptual diagram illustrating an example inductor-inductor-capacitor (LLC) converter as one isolating converter example of the resonant converter of FIG. 1, in accordance with one or more aspects of the present disclosure.

FIG. 2 is a conceptual diagram illustrating inductor-inductor-capacitor (LLC) converter 6A as one example of resonant converter 6 of FIG. 1, in accordance with one or more aspects of the present disclosure. FIG. 2 is described below in the context of system 1 of FIG. 1.

LLC converter 6A (referred to simply as "converter 6A") includes transformer 34 which separates the primary and secondary sides of converter 6A. The primary side of converter 6A includes the primary side winding of transformer 34 and switching circuit 21A. Switching circuit 21A includes power switches 24A and 24B (collectively "power switches 24") arranged in a half-bridge configuration about switching node 32. Power switch 24A is a high-side switch and power switch 24B is a low-side switch. The input terminals of switching circuit 21 are arranged between links 8A and 8B to receive the DC link voltage provided from source 2.

The primary side of converter 6A further includes resonant circuit 31 which is made up of capacitive element 27 and inductive elements 28 and 30. The output of switching circuit 21A corresponds to switching node 32 and is coupled to the input of resonant circuit 31. As a result of operation, resonant circuit 31 charges the output capacitances of power switches 24 when transitioning power switches 24 from a first to a second voltage.

Transformer 34 includes a secondary winding with a center tap resulting in two secondary winding sections. Each of the first and second secondary winding sections is inductively coupled with the primary winding. The secondary side of resonant converter 6A includes the secondary side winding of transformer 34, capacitive element 40, and rectification elements 36A and 36B (collectively referred to as "synch recs 36").

Controller unit 12 and driver circuit 22 control power switches 24 and rectification elements 36 by providing gate control signals across links 17A-17D. The DC link voltage from source 2 appears across power switches 24 at links 8A and 8B. Converter 6A provides an output voltage across capacitive element 40 at links 10A and 10B.

LLC converter 6A is configured to perform ZVS to improve its efficiency during power conversion operations by utilizing the magnetizing current generated by resonant circuit 31 to charge the output capacitances of power switches 24A and 24B when power switches 24A and 24B are being switched-on at zero volts. As such, to operate as efficiently as possible, LLC converter 6A operates with as low a magnetizing current as possible. To achieve this improved efficiency, LLC converter 6A relies on power switches 24 which have certain attributes that enable LLC converter 6A to operate with as low a magnetizing current as possible, without introducing dead time, and without reducing the range of available switching frequencies. These attributes of power switches 24 enable resonant circuit 31 to charge the output capacitance of power switches 24 using a lower than normal magnetizing current. As is described below, the attributes of power switches 24 result in a quantifiably low effective non-linearity coefficient associated with power switches 24 in addition to a quantifiably low figure-of-merit (FoM) associated with a product of an on-resistance ($R_{DS-ON}$) and output charge (Qoss) of power switches 24.

An effective non-linearity coefficient (NLC) associated with one or more power switches, such as power switches 24, is defined herein as being a function of the voltage across the power switches. The effective NLC defines an amount of deviation of a voltage transition (dv/dt), as compared to a completely (i.e., 100%) linear transition, across the power switches, as the voltage across one or more power switch transitions between a first and a second voltage. This effective non-linearity coefficient as a function of the voltage across the power switches NLC(V) is given by EQ 1:

$$NLC(V)=[Coss(V)+Coss(V_{HIGH})]/2*Coss(V_{MID}) \qquad \text{EQ. 1}$$

For example, consider that Coss(V) is the output capacitance as a function of the voltage across power switch 24 (e.g., between links 8A and 8B). $V_{HIGH}$ and $V_{MID}$ each depend on the rated "blocking voltage" or "breakdown voltage" of the power switches ($BV_{DSS}$) and are defined by EQS. 2 and 3:

$$V_{HIGH}=\tfrac{2}{3}*BV_{DSS}-V \qquad \text{EQ. 2}$$

$$V_{MID}=\frac{1}{3}*BV_{DSS} \qquad \text{EQ. 3}$$

The sum of the two output capacitances (Coss) associated with power switches 24, is also referred to as the "effective output capacitance" of power switches 24 as viewed from switching node 32 and is defined as $Coss(V)+Coss(V_{HIGH})$. The effective output capacitance associated with power switches 24, $Coss(V)+Coss(V_{HIGH})$, is the output capacitance being charged by the magnetizing current generated by resonant circuit 31 to transition power switches 24 from a first voltage to a second voltage. Normalizing the effective output capacitance of power switches 24 to the lowest sum of capacitances $2*Coss(V_{MID})$ represents a direct indicator of the amount of deviation that a voltage transition across power switches 24 deviates from a perfectly linear voltage transition.

For example, consider an example where the blocking capability $BV_{DSS}$ of power switches 24 is six hundred volts (600V). The non-linearity coefficient of power switches 24 at ten volts is defined by EQ. 4.

$$NLC(10V)=[Coss(10V)+Coss(390V)]/2*Coss(200V) \qquad \text{EQ. 4}$$

If the NLC at ten volts is equal to two, then the effective output capacitance of power switches 24, at 10V, is two times larger than the NLC of power switches 24 at two hundred volts. Accordingly, the rate of change of the voltage (dv/dt) at the switching node with a voltage of 10V applied to one of power switches 24 is two times lower than at 200V. Therefore, as used herein, the NLC of one or more power switches is directly related to the spectrum of the rate of voltage change along the transition of the power switches from the first voltage to the second voltage, and hence a direct indicator of the deviation from a perfectly linear transition between the first voltage and the second voltage. In other words, the NLC of the power switches indicates the non-linearity of the combined output capacitances (Coss) of the switches (e.g., two switches when arranged in a half bridge) at the switching node 32 or 33A/B respectively.

Power devices with especially good aptitude for resonant converters should provide a very low non-linearity coefficient across a large range of their blocking capability. For example for a 600V device we suggest a non-linearity coefficient to be below five at least between 20V and 200V (due to the symmetrical definition of Equation 1, this is corresponding with a voltage range of 20V and 380V). Even better would be a device offering a low non-linearity coefficient between 10V and 200V respectively 10V and 390V. In general, according to the definition of the mid voltage Vmid in Equation 3 the non-linearity coefficient should be below a first threshold from at least 20% to 100% of the mid voltage Vmid. In another embodiment the non-linearity coefficient should be below a first threshold from at least 10% to 100% of the mid voltage Vmid.

Accordingly, LLC converter 6A can improve its efficiency by reducing the required magnetizing current needed to charge the output capacitance of its power switches either by using individual power switches that each have a very low NLC or by using a combination of power switches that together have a very low effective NLC (e.g., as long as the sum of the output capacitances shows little variation). Some applications may require LLC converter 6A to have an effective NLC associated with power switches 24 that is less than or equal to five. Other applications may require LLC converter 6A to have an effective NLC associated with power switches 24 that is less than or equal to three. Still yet other applications may require LLC converter 6A to have an effective NLC associated with power switches 24 that is less than or equal to two. In general, an application should use a lower NLC coefficient for its switches for an increased switching frequency and reduced size EMI filter. For example, an example LLC converter at 100 kHz may operate with an NLC of five, whereas an example TCM boost converter may operate at 1 MHz with a NLC of less than 3. A different example TCM boost converter may operate at 3 MHz, and by relying on a very small notch filter type EMI filter, may require an NLC of less than 2.

As is described below with respect to the additional FIGS. (e.g., FIGS. 5-7), to achieve an effective NLC of five, three, or even two, LLC converter 6A may use power switches 24 which are based on wide band gap (e.g., Gallium Nitride [GaN]) high-electron-mobility-transistor (HEMT) technology. While other LLC converters rely on MOSFETS or Superjunction MOSFETS that have an effective NLC on the order of thirty or even one hundred, LLC converter 6A may use wide band gap HEMT devices, such as GaN HEMT devices, as power switches 24 and may achieve an effective NLC, at ten volts, of 1.44.

Just as a quantifiably low effective NLC associated with power switches 24 results in a low spectrum of rates of voltage change (dv/dt) and hence an EMI spectrum (radiated and/or conducted EMI spectrum) that is relatively easy to filer during the transition of power switches 24 from a first to second voltage, a quantifiably low figure-of-merit (FoM) associated with a product of an on-state resistance ($R_{DS-ON}$) (e.g., at twenty-five degrees centigrade) and output charge (Qoss) of power switches 24 may enable LLC converter 6A to use a lower magnetizing current to charge the output capacitance of power switches 24. Similar to the effective NLC of power switches 24, the FoM associated with the $R_{DS-ON}*Qoss$ is also a function of voltage. Qoss(V) is defined as the integral of Coss(V) from zero volt to V. In general, the lower the FoM, the better. Some applications may have a FoM associated with the $R_{DS-ON}*Qoss$ of less than 10 Ohm*nC. Some applications may have a FoM associated with the $R_{DS-ON}*Qoss$ of less than 6 Ohm*nC. And sill some applications may have a FoM associated with the $R_{DS-ON}*Qoss$ of less than 3 Ohm*nC.

In this way, LLC converter 6A can rely on specific devices to function as power switches 24 that have a low, effective NCL and a low FoM associated with the $R_{DS-ON}*Qoss$ to enable LLC converter 6A to achieve better performance by operating with as low a magnetizing current as possible, without introducing a significant amount of dead time, and with a narrow band of rates of voltage changes at the switching node and hence an EMI spectrum, that is relatively easy to filter. LLC converter 6A can achieve better performance without suffering from the drawbacks (e.g., requiring larger charging current, reduced efficiency, voltage transients, parasitic oscillations, etc.) that other resonant converters experience when using Superjunction MOSFETS or other types of MOSFETS that are characterized by a large, non-linear output capacitance.

Figure 3:
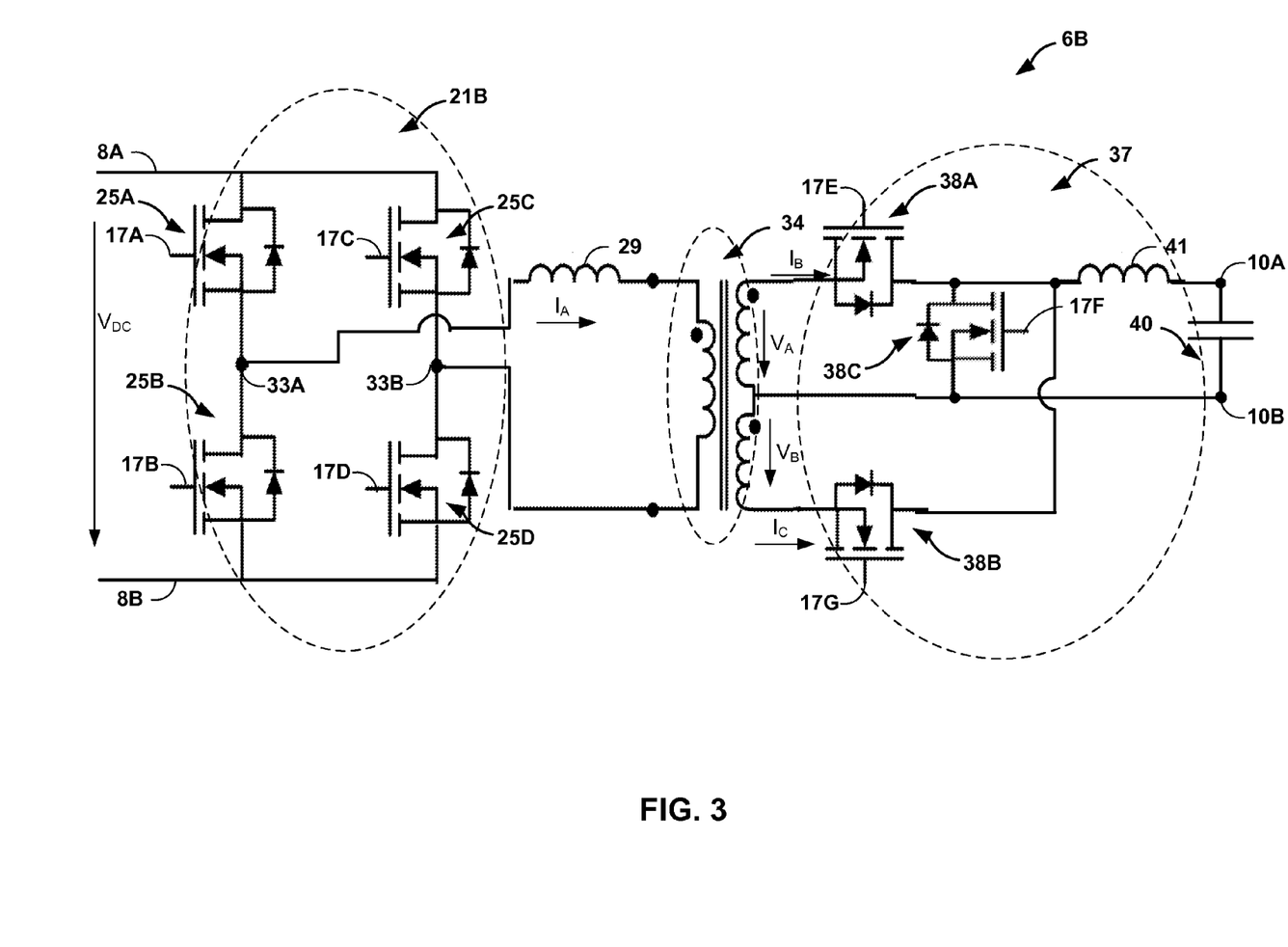
FIG. 3 is a conceptual diagram illustrating a phase shift zero voltage switching (ZVS) converter as one additional isolating converter example of the resonant converter of FIG. 1, in accordance with one or more aspects of the present disclosure.

FIG. 3 is a conceptual diagram illustrating phase shift zero voltage switching (ZVS) converter 6A as one example of resonant converter 6 of FIG. 1, in accordance with one or more aspects of the present disclosure. FIG. 3 is described below in the context of system 1 of FIG. 1.

The primary side of phase shift ZVS converter 6B (referred to simply as "converter 6B") includes switching circuit 21B which includes two half-bridges each including a high-side power switch 25A, 25C and a low-side power switch 25B, 25C (collectively referred to as "power switches 25") connected at their respective input terminals at links 8A and 8B for receiving the DC link voltage from source 2. A series circuit with an inductive storage element 29 and the primary winding of transformer 34 is connected between the output terminals of the two half bridges at nodes 33A and 33B.

Rectifier circuit 37 includes a series circuit with an inductive storage element 41 and a capacitive storage element 40. The first secondary winding section of transformer 34 is coupled to this series circuit 41, 40, through a first rectifier element 38A, and the second secondary winding section of transformer 34 is coupled to this series circuit 41, 40, through a second rectifier element 38B. A third rectifier element 38C is connected in parallel with the series circuit with the inductive storage element 41 and the capacitive storage element 40. Specifically, the inductive storage element 41 is connected to the first secondary winding section through the first rectifier element 38A and to the second secondary winding section through the second rectifier element 38B. A center tap of the secondary winding of transformer 34 is connected to that circuit node of the capacitive storage element 40 opposite inductive storage element 41 and to link 10B, and inductive storage element 41 and capacitive storage element 40 are coupled together at link 10A.

Controller unit 12 and driver circuit 22 control power switches 25 and rectifier elements 38 by providing gate control signals across links 17A-17G. The DC link voltage from source 2 appears across power switches 25 at links 8A and 8B. Converter 6B provides an output voltage across capacitive element 40 at links 10A and 10B. Power switches 25 of the half-bridges are cyclically switched on and off by gate signals from driver circuit 22 which are dependent on the drive control signal received from controller unit 12, in accordance with a specific drive scheme that includes four different phases.

In a first phase, high-side switch 25C of the second half-bridge and low-side switch 25B of the first half-bridge are switched off while high-side switch 25A of the first half-bridge and low-side switch 25D of the second half-bridge are switched on. Thus, a current $I_A$ flows through the first inductive storage element 29 and the primary winding of transformer 34. Voltages $V_A$ and $V_B$ across the respective secondary winding sections have polarities as indicated in FIG. 3 when the DC link voltage across links 8A and 8B has a polarity as indicated in FIG. 3. The voltage $V_A$ across the first secondary winding section causes a current $I_B$ through the first rectifier element 38A, the second inductive storage element 41 and the capacitive storage element 40, while the second rectifier element 38B blocks.

In a second phase, low side switch 25B of the first half-bridge are switched-off and high side switch 25C of the second half-bridge are switched off while high side switch 25A of the first half-bridge is switched on Switch 25D being switched on in the first phase is turned off at the beginning of the second phase. The energy stored in magnetic element 29 associated with the primary side load current and the energy stored in magnetic element 41 associated with the secondary side load current will charge the output capacitance of switch 25D from 0V to the DC link voltage and will discharge the output capacitance of switch 25C from DC link voltage down to 0V. Once switch 25C achieves Zero-voltage switching switch 25C is turned on. There may be a short time where the current discharging the output capacitance of switch 25C flows through the body diode of switch 25C.

In the second phase, the voltage across the primary winding of transformer 34 and the voltages $V_A$ and $V_B$ across the secondary winding sections of transformer 34 reach zero once switch 25C is turned on. The current $I_B$ through inductive storage element 41 may continue to flow, where rectifier element 38C takes over the current through inductive storage element 41 and capacitive storage element 40 (e.g., in continuous current mode operation).

At the begin of the third phase switch 25A is turned off; the energy stored in magnetic element 29 will charge the output capacitance of switch 25A from 0V to DC link voltage and discharge the output capacitance of switch 25B from DC link voltage down to 0V. Once switch 25B achieves ZVS condition it may be turned on. The voltages $V_A$ and $V_B$ across the secondary winding sections of transformer 34 have polarities opposite to the polarities indicated in FIG. 3. In this case, a current $I_C$ flows through the second secondary winding section of transformer 34 that is coupled to rectifier element 38B, through rectifier element 38B, through inductive storage element 41 and capacitive storage element 40.

In the fourth phase, low-side switch 25B of the first half-bridge is switched on, and high-side switch 25C of the second half-bridge is switched off. The current flows in forward direction through switch 25B and in reverse direction through switch 25D The voltage across the primary winding of transformer 34 and the voltages $V_A$ and $V_B$ across the secondary winding sections of transformer 34 drop to zero. The current through inductive storage element 41 and capacitive storage element 40 continuous to flow, where rectifier element 38B provides a current path for this current.

According to one embodiment, a timing of switching on and switching off power switches 25 is such that at least some power switches 25 are switched on and/or switched off when the voltage across the respective switch is zero. In some examples, the output current that exits converter 6B at link 10A can be controlled in order to regulate the output voltage across capacitive element 40 (in a master DC/DC converter), or in order to regulate the DC link voltage (in a slave DC/DC converter) between links 8A and 8B. The output current can be regulated by adjusting the time durations of the first and third phases of the drive scheme referenced above (e.g., an increase of these time durations may result in an increase of the output current).

Converter 6B is configured to perform ZVS to improve its efficiency during power conversion operations by utilizing the load current coming from load 4 at links 10A and 10B to charge the output capacitances of power switches 25 when power switches 25 are being switched-on at zero volts. As such, to operate as efficiently as possible, converter 6B operates with a minimum load current required to charge the output capacitances of those power switches 25 that are being switched on. Unfortunately, during zero or light load conditions, the load current may be insufficient to charge the output capacitances of power switches 25 resulting in a situation where ZVS with converter 6B is not possible.

In order to achieve ZVS during a conditions when the load current is less, converter 6B relies on a combination of power switches 25 that together have a very low effective NLC, a low figure-of-merit (FoM) associated with a product of an on-resistance ($R_{DS-ON}$) and output charge (Qoss) of power switches 24, and also a low FoM associated with a product of the $R_{DS-ON}$ and output energy (Eoss). Eoss(V) of a power switch is defined as the integral across Coss*V from zero volt to V.

As is described below with respect to the additional FIGS. (e.g., FIGS. 5-7), and just like with converter 6A, to achieve an effective NLC of five, three, or even two, converter 6B may use power switches 25 which are based on wide band gap (e.g., Gallium Nitride [GaN]) high-electron-mobility-transistor (HEMT) technology. While other resonant converters rely on MOSFETS or Superjunction MOSFETS that have an effective NLC on the order of thirty or even one hundred, converter 6B may use GaN HEMT devices as power switches 25 and may achieve an effective NLC, at ten volts, of 1.44.

In this way, converter 6B can rely on specific devices to function as power switches 25 that have a low, effective NCL, a low FoM associated with the $R_{DS\text{-}ON}$*Qoss, and a low FoM associated with the $R_{DS\text{-}ON}$*Eoss to enable converter 6B to achieve better performance by performing ZVS with even at very little load current (such as at 20% of the current level required for full load condition), without introducing a significant amount of dead time, and with a very narrow band of rates of voltage changes at the switching node and hence an EMI spectrum, that is relatively easy to filter. For example, in some applications, converter 6B may have a FoM associated with the Ron*Eoss of less than 0.7 Ohm*µJ, a FoM associated with the $R_{DS\text{-}ON}$*Qoss of less than 7 Ohm*nC, and a NLC of less than 5. Converter 6B can achieve better performance without suffering from the drawbacks (e.g., requiring of a larger charging current, reduced efficiency, voltage transients, parasitic oscillations, etc.) that other resonant converters experience when using Superjunction MOSFETS or other types of MOSFETS that are characterized by a large, non-linear output capacitance (e.g., when charged with a constant charging current).

Figure 4:
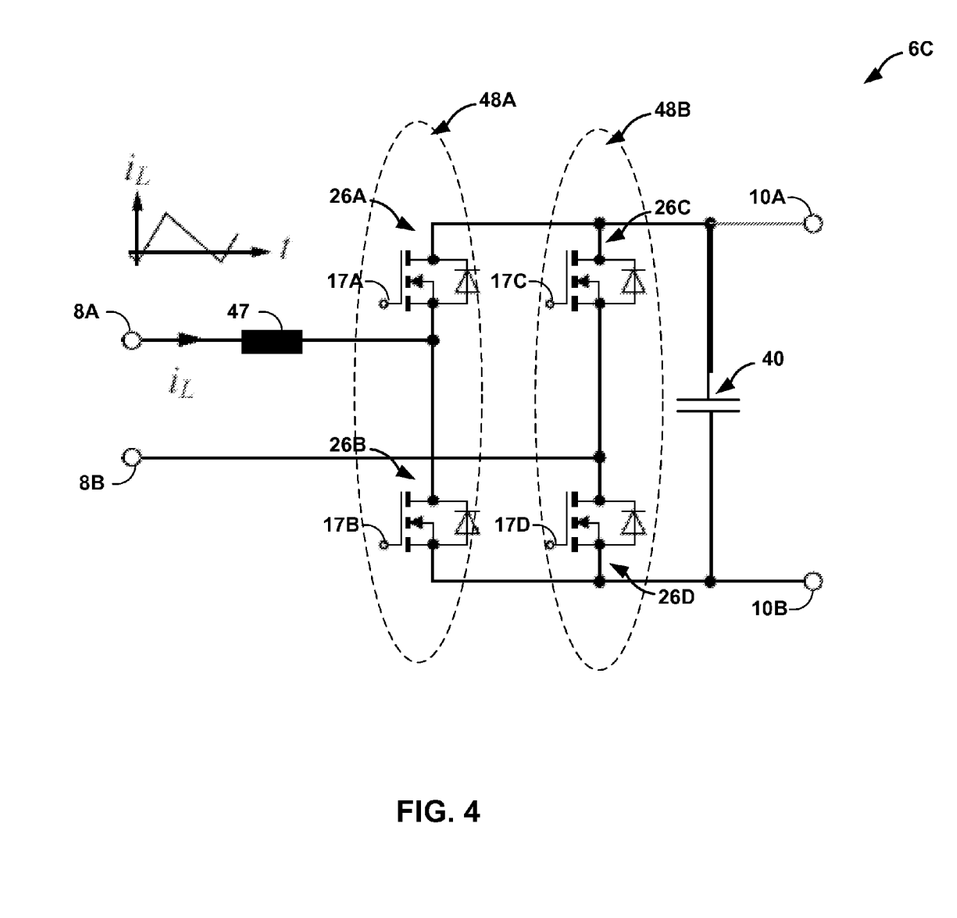
FIG. 4 is a conceptual diagram illustrating a triangular current mode (TCM) converter as one non-isolating converter example of the resonant converter of FIG. 1, in accordance with one or more aspects of the present disclosure.

FIG. 4 is a conceptual diagram illustrating triangular current mode (TCM) converter 6C as one non-isolating converter example of resonant converter 6 of FIG. 1, in accordance with one or more aspects of the present disclosure. As a TCM boost converter, resonant converter 6C can operate at a very high switching frequency with very good efficiency while requiring only a relatively low amount of energy to be transferred back from load 4 to perform ZVS.

TCM converter 6C includes, capacitive storage element 40, inductive element 47, and power switches 26A-26D. Power switches 26A and 26B represent half-bridge 48A which operates at a high switching frequency with ZVS. Power switches 26C and 26D represent half-bridge 48B which operates at the same frequency of the "mains" (e.g., the frequency of the oscillations of alternating current (AC) transmitted from power source 2). TCM converter 6C is a non-isolating converter because TCM converter 6 does not include a transformer or any other isolation component that electrically isolates source 2 at link 8 from load 4 at link 10. Rather than include a transformer, TCM converter 6C relies on the precise control of power switches 26A to 26D to start and stop energy transfers between source 2 and load 4.

Power switches 26A-26D are arranged to transfer energy from source 2 to capacitive storage element 40 as source 2 provides current pulses at link 10. Controller unit 12 sends gate signals over links 17 to control power switches 26A and 26B so that charge builds up at capacitive storage element 40. Controller unit 12 sends gate signals over links 17 to control power switches 26C and 26D to perform synchronous rectification techniques parallel to the diode being present in switches 26C and 26D. For example, in operation, the current through inductive element 47 may increase and decrease in a triangular waveform. For example at a positive voltage between nodes 8A and 8B, turning on switch 26B will cause the current through inductive element 47 to increase; the current will return through switch 26D. Turning off switch 26B will lower the voltage across switch 26A until the current is taken over by the diode of switch 26B. After this point in time the channel of switch 26A can be turned on, thus achieving full Zero voltage switching and performing synchronous rectification operation. The inductive element 47 now works against the voltage across capacitive element 40 and charges it. The current will decrease. Once the current has decreased below Zero the diode of switch 26A will stop to conduct; the current flows through the channel of switch 26A entirely. Turning off switch 26A at a point in time when the current has decreased to a given threshold will allow discharging of the voltage across switch 26B prior to turning on. Thus, by relying on energy transfer from capacitive element 40 to power source 12 in at least one operation mode helps to achieve zero voltage switching of switch 26A and thus to operate the converter at a higher efficiency.

Similar to converter 6B, converter 6C is configured to perform ZVS to improve its efficiency during power conversion operations by utilizing the load current coming from load 4 at links 10A and 10B to charge the output capacitances of power switches 26A and 26B. As such, to operate as efficiently as possible, converter 6C operates with a minimum load current required to charge the output capacitances of those power switches 26 that are being switched on.

In order to achieve ZVS with as little negative current from the load back to the source and to achieve a voltage transition with a narrow spectrum of dv/dt values, converter 6C relies on a combination of power switches 26 that together have a very low effective NLC, a low figure-of-merit (FoM) associated with a product of an on-resistance ($R_{DS\text{-}ON}$) and output charge (Qoss) of power switches 26. As is described below with respect to the additional FIGS. (e.g., FIGS. 5-7), and just like with converters 6A and 6B, to achieve an effective NLC of five, three, or even two, converter 6C may use power switches 26 which are based on wide band gap (e.g., Gallium Nitride [GaN]) high-electron-mobility-transistor (HEMT) technology. While other resonant converters rely on MOSFETS or Superjunction MOSFETS that have an effective NLC on the order of thirty or even one hundred, converter 6C may use GaN HEMT devices as power switches 26 and may achieve an effective NLC, at ten volts, of 1.44.

In this way, converter 6C can rely on specific devices to function as power switches 26 that have a low, effective NCL, a low FoM associated with the $R_{DS\text{-}ON}$*Qoss, to achieve better performance by performing ZVS with a very little amount of negative current from the load without introducing a significant amount of dead time, and with a very narrow band of rates of voltage changes at the switching node and hence an EMI spectrum, that is relatively easy to filter. For example, in some applications, converter 6C may have a FoM associated with the $R_{DS\text{-}ON}$*Qoss of less than 7 Ohm*nC, and a NLC of less than 5. Converter 6C can achieve better performance without suffering from the drawbacks (e.g., requiring of a larger charging current, reduced efficiency, voltage transients, parasitic oscillations, etc.) that other resonant converters experience when using Superjunction MOSFETS or other types of MOSFETS that are characterized by a large, non-linear output capacitance (e.g., when charged with a constant charging current).

Figure 5:
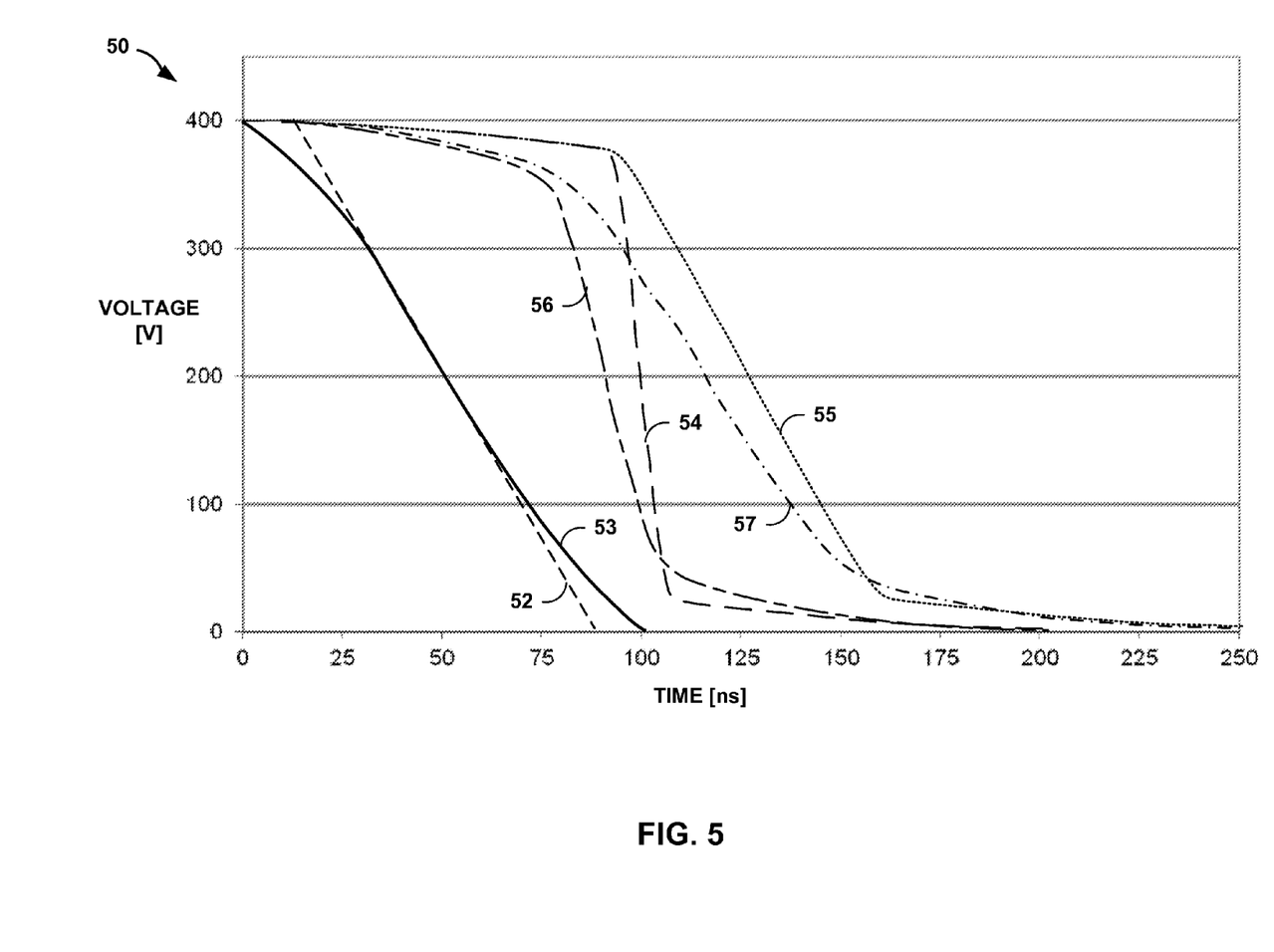
FIG. 5 is a line graph illustrating a change in voltage over time of one or more of the power switches of the example resonant converters of FIGS. 2-4, in accordance with one or more aspects of the present disclosure.
Figure 6:
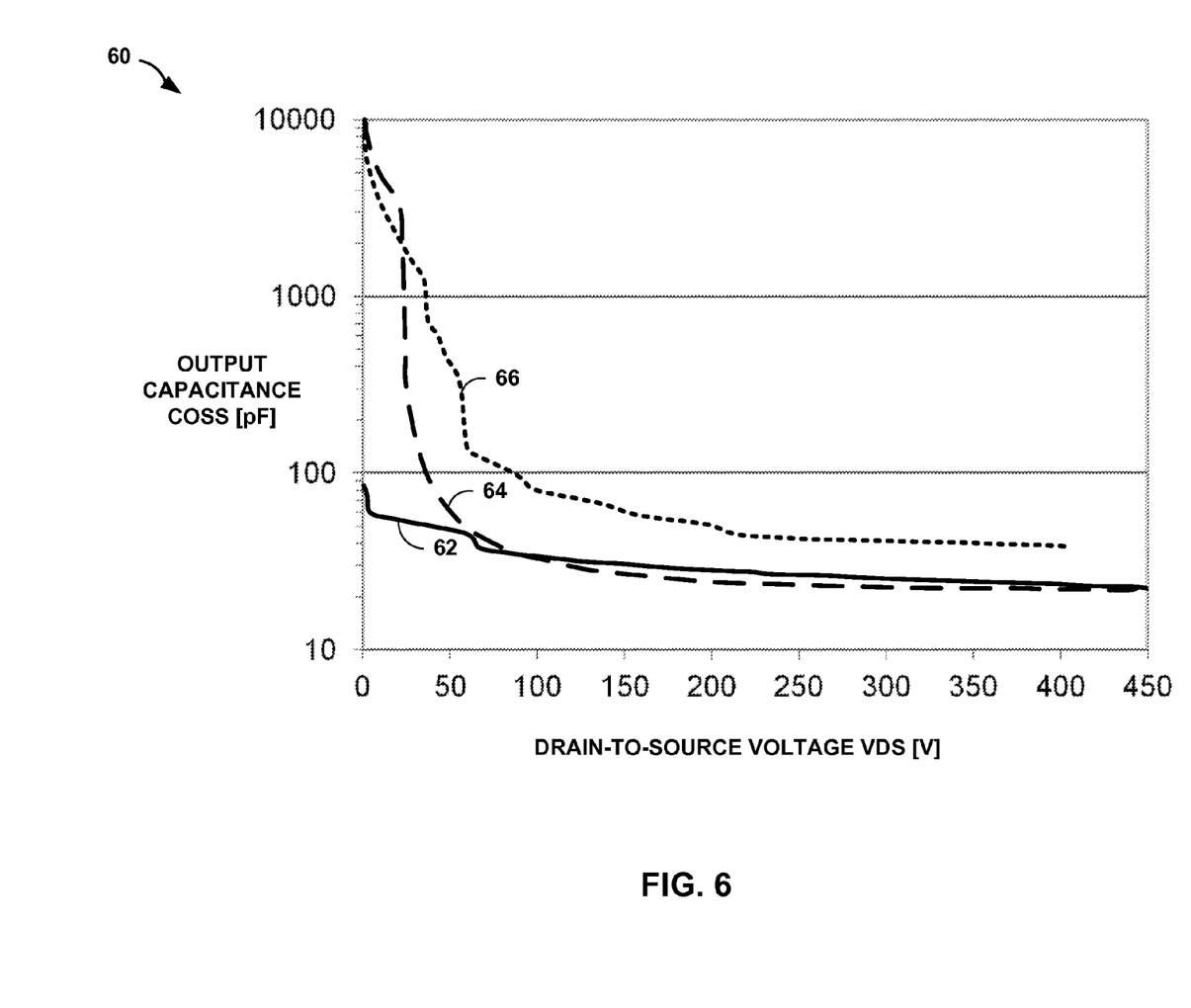
FIG. 6 is a line graph comparing respective output capacitance (Coss) to respective drain-to-source voltage (VDS) of one or more of the power switches of the example resonant converters of FIGS. 2-4, in accordance with one or more aspects of the present disclosure.
Figure 7:
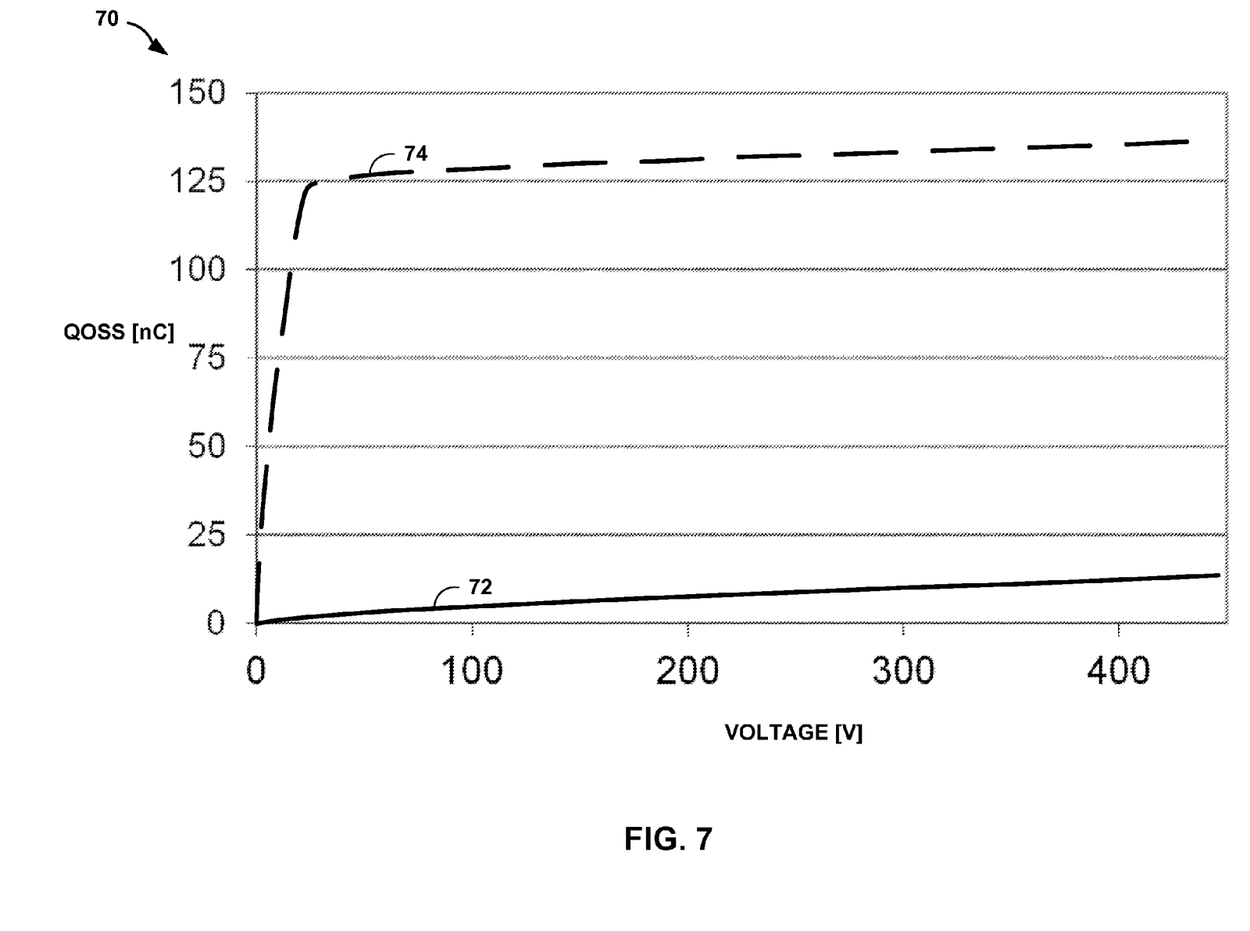
FIG. 7 is a line graph illustrating respective amounts of charge (Qoss) to respective voltages (V) of one or more of the power switches of the example resonant converters of FIGS. 2-4, during zero voltage switching (ZVS) operations, in accordance with one or more aspects of the present disclosure.

FIGS. 5-7 illustrate how wide band gap technology HEMT devices, such as GaN type devices, may have certain device attributes that when used in a resonant converter, can provide the resonant converter a way to achieve near optimum converter attributes. FIG. 5 is a line graph illustrating a change in voltage over time (dv/dt) of one or more of power switches 24 and 25 of resonant converters 6A through 6C of FIGS. 2, 3 and 4, in accordance with one or more aspects of the present disclosure. Plots 53-57 illustrate the magnitude of deviation associated with different types of power switch technology from a purely linear transition with a constant value of dv/dt, which is shown as comparison in plot 52. Plot 52 shows the change in voltage from 400 to 0. The voltage transition has a single slope and a constant value of dv/dt, and as such, is not likely to induce unwanted oscillations in parasitic elements of a resonant converter. Its resulting EMI spectrum can be filtered with relatively little effort.

Plot 54 is the voltage transition of a Superjunction MOSFET fabricated on a technology node yielding a Figure-of-merit of on-state resistance*area of 1.0 Ohm*mm$^2$ while being charged with a charging current of 1.5 amps. Plot 55 is the voltage transition of the Superjunction MOSFET shown in plot 54 having additionally a two-hundred and twenty pico farad (pF) capacitor connected in parallel and being charged with a charging current of 1.5 amps. Plot 56 is the voltage transition of a Superjunction MOSFET fabricated on a technology node yielding a Figure-of-merit of on-state resistance*area of 2.4 Ohm*mm$^2$ while being charged with a charging current of 1.5 amps. Plot 57 is the voltage transition of the Superjunction MOSFET shown in plot 56 having additionally a two-hundred and twenty pico farad (pF) capacitor connected in parallel and being charged with a charging current of 1.5 amps. As shown above Superjunction devices have very high values of NLC resulting in steep voltage transitions; the effect of these high values of NLC can be compensated by adding a parallel capacitor. Adding a capacitor in parallel requires however a relatively high charging current and requires a relatively long delay time.

Lastly, plot 53 is the voltage transition associated with power switches according to one or more aspects of the present disclosure. Plot 53 shows a device with a NLC factor at 10V of below 2, a figure-of-merit RDSon*Qoss of below 10 Ohm*nC at a charging current of only 0.3 A, hence one fifth of the charging current required for the other MOSFETs in plots 54 through 57.

New material systems such as GaN and device concepts such as lateral High electron mobility transistors may enable power devices as described herein to have as nearly an ideal solution for resonant converters having a narrow band of rate of voltage changes and requiring a very low charging current. Furthermore the slope of the voltage transition may be precisely controlled by the amount of charging current. In other words, if a system needs to achieve a given voltage transition slope, the system can—due to very low values of the NLC—set a desired value of the rate of voltage change by setting (e.g., in an LLC converter) the corresponding level of magnetizing current. In the case of non-isolating resonant converters such as the TCM boost converter, the triangular waveform of the charging current may yield still to a significantly lower spectrum of rates of voltage change than other power MOSFETs. transitions are contained to a very narrow band of rate of voltage changes (dv/dt values) and hence having an EMI spectrum, which is relatively easy to filter.

FIG. 6 is a line graph comparing respective output capacitance (Coss) to respective drain-to-source voltage (VDS) of one or more of the power switches 24 and 25 of resonant converters 6A through 6C of FIGS. 2, 3, and 4, in accordance with one or more aspects of the present disclosure. Plot 62 represents Coss (V) of a power switch in accordance with one or more aspects of the present disclosure, and plots 64 and 66 represent Coss (V) of Superjunction MOSFETs having a FoM RDSon*area of 1.0 Ohm*mm$^2$ and 2.4 Ohm*mm$^2$ respectively.

As shown in FIG. 6, power devices with a typical capacitance curve as plotted in plot 62 have significantly lower capacitances especially at low voltage and a very low NLC. It is noteworthy, that the concept of a good non-linearity coefficient does not necessarily require a capacitance curve which is basically constant over a wide voltage range. However the sum of the two capacitances, each at the voltage levels as defined in Equations 1 through 3 above, defines the aptitude of a given device technology for resonant converters as laid out in this disclosure.

Even though GaN devices in general may lead to a reduced charge stored in the output capacitance, specific care needs to be applied to create a device, even if a using GaN, with a very low NLC as defined in Equation 1. Using for example normally-on GaN HEMTs in a Cascode arrangement may add a substantial amount of capacitance at low voltage (e.g., between 0V and 10V). The resulting effective capacitance curve at the switching node of the half bridge has hence a significant capacitance peak both between 0V and 10V and between 390V and 400V (if we have a converter operating from or to 400V DC link as an example). The non-linearity coefficient hence deteriorates, even though the base technology of a GaN HEMT offers already advantages in the context of this disclosure. We suggest hence to use a normally-off GaN HEMT device with specific care being taken on the characteristic capacitance curve to achieve both a low Non-linearity coefficient and a good FoM on-state resistance times charge of the output capacitance (Ron*Qoss).

FIG. 7 is a line graph illustrating respective amounts of charge (Qoss) to respective voltages (V) of one or more of power switches 24 and 25 of resonant converters 6A through 6C of FIGS. 2, 3 and 4, during ZVS operations, in accordance with one or more aspects of the present disclosure. Plot 72 represents Qoss(V) of a power switch in accordance with one or more of the aspects of the present disclosure, and plot 74 represents Qoss(V) of a MOSFET fabricated with a Superjunction technology yielding a figure-of-merit On-state resistance*area of 1.0 Ohm*mm$^2$. Power MOSFETs with a low charge stored in the output capacitance allow at a given charging current relatively short dead times or alternatively at a given dead time a relatively low amount of charging current. This allows a reduction of the conduction losses associated with the resonant tank of the resonant converter or with the energy required to be supplied from the load to the power source to achieve zero-voltage switching. The efficiency of the converter especially in light load condition will therefore be improved.

Clause 1. A resonant converter comprising: at least one power switch, wherein the at least one power switch is characterized by a non-linearity coefficient that is less than or equal to a first threshold and a figure-of-merit that is less than or equal to a second threshold, the figure-of-merit being associated with an on-resistance of the at least one power switch and an output charge of the at least one power switch.

Clause 2. The resonant converter of clause 1, wherein the resonant converter comprises a non-isolating resonant converter that does not include a transformer.

Clause 3. The resonant converter of any of clauses 1-2, wherein the resonant converter comprises an isolating resonant converter that includes a transformer.

Clause 4. The resonant converter of any of clauses 1-3, wherein the at least one power switch is a normally-off Gallium Nitride (GaN) high-electron-mobility transistor (HEMT).

Clause 5. The resonant converter of any of clauses 1-4, wherein the non-linearity coefficient is less than or equal to the first threshold when the at least one power switch blocks a voltage that is between approximately ten percent to one hundred percent of a mid-voltage of the at least one power switch, the mid-voltage being one third of a rated blocking voltage of the at least one power switch.

Clause 6. The resonant converter of any of clauses 1-5, wherein the non-linearity coefficient is less than or equal to the first threshold when the at least one power switch blocks a voltage that is between approximately twenty percent to one hundred percent of a mid-voltage of the at least one power switch, the mid-voltage being one third of a rated blocking voltage of the at least one power switch.

Clause 7. The resonant converter of any of clauses 1-6, wherein the first threshold is equal to five.

Clause 8. The resonant converter of clause 7, wherein the first threshold is equal to three.

Clause 9. The resonant converter of clause 8, wherein the first threshold is equal to two.

Clause 10. The resonant converter of any of clauses 1-9, wherein the second threshold is equal to 8 Ohm*nC.

Clause 11. The resonant converter of any of clauses 1-10, wherein the second threshold is equal to 6 Ohm*nC.

Clause 12. The resonant converter of any of clauses 1-11, wherein the resonant converter is an inductor-inductor-capacitor (LLC) type resonant converter.

Clause 13. The resonant converter of any of clauses 1-12, wherein the resonant converter is a phase shift zero voltage switching type resonant converter.

Clause 14. The resonant converter of any of clauses 1-13, wherein the resonant converter is a triangle current mode (TCM) boost type resonant converter.

Clause 15. The resonant converter of any of clauses 1-14, wherein the figure-of-merit is a first figure-of-merit and the at least one power switch is further characterized by a second figure-of-merit that is less than or equal to a third threshold, the second figure-of-merit being associated with the on-resistance of the at least one power switch and an output energy of the at least one power switch.

Clause 16. The resonant converter of clause 15, wherein the product is a first product and the second figure-of-merit is based on a second product of the on-resistance of the at least one power switch and the output energy of the at least one power switch.

Clause 17. The resonant converter of any of clauses 1-16, wherein the third threshold is equal to 0.8 Ohm*μJ (Ohm*micro Joule).

Clause 18. The resonant converter of clause 17, wherein the third threshold is equal to 0.4 Ohm*μJ.

Clause 19. The resonant converter of any of clauses 1-18, wherein the at least one power switch comprises two power switches arranged in a half-bridge configuration and the non-linearity coefficient is an effective non-linearity coefficient measured at a switching node of the half-bridge configuration.

Clause 20. The resonant converter of any of clauses 1-19, wherein the at least one power switch comprises four power switches arranged in two parallel half-bridge configurations and the non-linearity coefficient is an effective non-linearity coefficient measured at an output of the two half-bridge configurations.

Clause 21. The resonant converter of any of clauses 1-20, wherein the at least one power switch comprises at least one wide band gap type device.

Clause 22. The resonant converter of clause 21, wherein the at least one power switch comprises at least one Gallium Nitride (GaN) high-electron-mobility-transistor.

Clause 23. The resonant converter of clause 22, wherein the first threshold is less than two when the voltage across the at least one power switch is approximately ten volts.

Clause 24. A power circuit comprising: a resonant converter that includes at least one half-bridge, wherein the at least one half-bridge has an effective non-linearity coefficient that is less than or equal to five and a figure-of-merit that is less than or equal to eight Ohm*nC, the figure-of-merit being associated with an on-resistance of the at least one half-bridge and an output charge of the at least one half-bridge.

Clause 25. The power circuit of clause 24, wherein the resonant converter is the resonant converter of any of clauses 1-24.

Clause 25. A system comprising: a power source configured to provide power; a controller unit; a load configured to receive the power; and a resonant converter configured to convert the power for the load, the resonant converter includes at least one half-bridge controlled by the controller unit, wherein the at least one half-bridge has an effective non-linearity coefficient that is less than or equal to five and a figure-of-merit that is less than or equal to eight Ohm*nC, the figure-of-merit being associated with an on-resistance of the at least one half-bridge and an output charge of the at least one half-bridge.

Clause 26. The system clause 25, wherein the resonant converter is the resonant converter of any of clauses 1-24.

Various examples of the disclosure have been described. These and other examples are within the scope of the following claims.

The invention claimed is:

1. A resonant converter comprising:
at least one power switch that configures the resonant converter to continuously maintain a regulation span of an output voltage of the resonant converter, wherein:
the at least one power switch configures the resonant converter to continuously maintain the regulation span of the output voltage based at least in part on being characterized by a non-linearity coefficient that is less than or equal to a first threshold and a figure-of-merit that is less than or equal to a second threshold,
the non-linearity coefficient defines an amount of deviation in a rate of change of a voltage across the at least one power switch, as compared to a linear rate of change, when regulating the output voltage,
the figure-of-merit defines a product between an on-resistance of the at least one power switch and an output charge of the at least one power switch when regulating the output voltage,
the first threshold depends on a switching frequency of the resonant converter and is less than or equal to five, and
the second threshold depends on a magnetizing current associated with the resonant converter and is less than or equal to eight ohm*nano coulomb.

2. The resonant converter of claim 1, wherein the resonant converter comprises a non-isolating resonant converter that does not include a transformer.

3. The resonant converter of claim 1, wherein the resonant converter comprises an isolating resonant converter that includes a transformer.

4. The resonant converter of claim 1, wherein the at least one power switch is a normally-off Gallium Nitride (GaN) high-electron-mobility transistor (HEMT).

5. The resonant converter of claim 1, wherein the non-linearity coefficient further configures the resonant converter to continuously maintain the regulation span of the output voltage based at least in part on being less than or equal to the first threshold when the at least one power switch blocks the voltage across the at least one power switch when the voltage across the at least one power switch is between approximately ten percent to one hundred percent of a mid-voltage of the at least one power switch, the mid-voltage being one third of a rated blocking voltage of the at least one power switch.

6. The resonant converter of claim 1, wherein the non-linearity coefficient further configures the resonant converter to continuously maintain the regulation span of the output voltage based at least in part on being less than or equal to the first threshold when the at least one power switch blocks the voltage across the at least one power switch when the voltage across the at least one power switch is between approximately twenty percent to one hundred percent of a mid-voltage of the at least one power switch, the mid-voltage being one third of a rated blocking voltage of the at least one power switch.

7. The resonant converter of claim 1, wherein the first threshold is equal to five.

8. The resonant converter of claim 7, wherein the first threshold is equal to three.

9. The resonant converter of claim 8, wherein the first threshold is equal to two.

10. The resonant converter of claim 1, wherein the second threshold is equal to 8 ohm*nano coulomb.

11. The resonant converter of claim 1, wherein the second threshold is equal to 6 ohm*nano coulomb.

12. The resonant converter of claim 1, wherein the resonant converter is an inductor-inductor-capacitor (LLC) type resonant converter.

13. The resonant converter of claim 1, wherein the resonant converter is a phase shift zero voltage switching type resonant converter.

14. The resonant converter of claim 1, wherein the resonant converter is a triangle current mode (TCM) boost type resonant converter.

15. The resonant converter of claim 1, wherein:
the figure-of-merit is a first figure-of-merit;
the product is a first product;
the at least one power switch configures the resonant converter to continuously maintain the regulation span of the output voltage based at least in part on being further characterized by a second figure-of-merit that is less than or equal to a third threshold;
the second figure-of-merit defines a second product between the on-resistance of the at least one power switch and an output energy of the at least one power switch; and
the third threshold depends on a magnetizing current associated with the resonant converter and is less than or equal to eight tenths ohm*micro joule.

16. The resonant converter of claim 15, wherein the third threshold is equal to eight tenths ohm*micro joule.

17. The resonant converter of claim 15, wherein the third threshold is equal to four tenths ohm*micro joule.

18. The resonant converter of claim 1, wherein the at least one power switch comprises two power switches arranged in a half-bridge configuration and the non-linearity coefficient is an effective non-linearity coefficient measured at a switching node of the half-bridge configuration.

19. The resonant converter of claim 1, wherein the at least one power switch comprises four power switches arranged in two parallel half-bridge configurations and the non-linearity coefficient is an effective non-linearity coefficient measured at an output of the two half-bridge configurations.

20. The resonant converter of claim 1, wherein the at least one power switch comprises at least one wide band gap type device.

21. The resonant converter of claim 20, wherein the at least one power switch comprises at least one Gallium Nitride (GaN) high-electron-mobility-transistor.

22. The resonant converter of claim 21, wherein the first threshold is less than two when the voltage across the at least one power switch is approximately ten volts.

23. A power circuit comprising:
a resonant converter that includes at least one half-bridge that configures the resonant converter to continuously maintain a regulation span of an output voltage of the resonant converter, wherein:
the at least one half-bridge configures the resonant converter to continuously maintain the regulation span of the output voltage based at least in part on being characterized by having an effective non-linearity coefficient that is less than or equal to a first threshold and a figure-of-merit that is less than or equal to a second threshold,
the non-linearity coefficient defines an amount of deviation in a rate of change of a voltage across the at least one half-bridge, as compared to a linear rate of change, when regulating the output voltage,
the figure-of-merit defines a product between an on-resistance of the at least one half-bridge and an output charge of the at least one half-bridge when regulating the output voltage,
the first threshold depends on a required switching frequency of the resonant converter and is less than or equal to five, and
the second threshold depends on a required magnetizing current associated with the resonant converter and is less than or equal to eight ohm*nano coulomb.

24. A system comprising:
a power source configured to provide power;
a controller unit;
a load configured to receive the power; and
a resonant converter configured to convert the power for the load, the resonant converter includes at least one half-bridge, wherein:
the at least one half bridge is controlled by the controller unit;
the at least one half bridge configures the resonant converter to continuously maintain a regulation span of an output voltage of the resonant converter based at least in part on being characterized by having an effective non-linearity coefficient that is less than or equal to a first threshold and a figure-of-merit that is less than or equal to a second threshold,
the non-linearity coefficient defines an amount of deviation in a rate of change of a voltage across the at least one half-bridge, as compared to a linear rate of change, when regulating the output voltage,
the figure-of-merit defines a product between an on-resistance of the at least one half-bridge and an output charge of the at least one half-bridge when regulating the output voltage,
the first threshold depends on a required switching frequency of the resonant converter and is less than or equal to five, and
the second threshold depends on a required magnetizing current associated with the resonant converter and is less than or equal to eight ohm*nano coulomb.

* * * * *